United States Patent [19]
Hummel

[11] 3,723,120

[45] Mar. 27, 1973

[54] PROCESS FOR HARDENING PHOTOHARDENABLE IMAGES

[75] Inventor: Karl Frederick Hummel, Robbinsville, N.J.

[73] Assignee: E. I. du Pont De Nemours and Company, Wilmington, Del.

[22] Filed: Aug. 30, 1971

[21] Appl. No.: 176,309

Related U.S. Application Data

[63] Continuation-in-part of Ser. No. 763,028, Sept. 26, 1968, abandoned.

[52] U.S. Cl. ..................96/35.1, 96/115 P, 204/158, 117/10, 117/37

[51] Int. Cl. ..............................................G03c 5/14

[58] Field of Search ........96/115 P, 35.1, 27; 117/10, 117/37; 204/158

[56] References Cited

UNITED STATES PATENTS 2,367,660 1/1945 Agre ..................................96/115 P

*Primary Examiner*—J. Travis Brown
*Attorney*—William R. Moser

[57] ABSTRACT

Photographic images comprising photopolymerizable material on a base support are posthardened by immersing said images in a liquid medium that transmits actinic radiation and which is inert with respect to the photopolymerizable material, and exposing them to an intense source of actinic radiation for a short period.

9 Claims, No Drawings

PROCESS FOR HARDENING PHOTOHARDENABLE IMAGES

This is a continuation-in-part of application, Ser. No. 763,028, filed Sept. 26, 1968, now abandoned.

BACKGROUND OF THE INVENTION

1. Field of the Invention

This invention relates to processes for improving the quality and durability of photopolymerizable images. More particularly, it relates to processes for hardening photopolymerizable images and more particularly for post-exposing to actinic radiation photopolymer film images immersed in a liquid medium which is inert with respect to the photopolymerizable images.

2. Description of Prior Art

Posthardening of photopolymerizable images by exposure to a light source in an inert gas atmosphere, in a vacuum, and through a cover sheet is well known in the art. The most common techniques, those using a temporary cover sheet as an oxygen barrier and as protection for the photopolymer layer, involve prolonged periods of exposure (up to 30 min.) at elevated temperatures (up to 100° C).

The prior art teaches that the reduction of the amount of oxygen in the polymerization atmosphere is beneficial, influencing the rate of the polymerization process. The prior art also discloses processes for pretreating photopolymerizable elements to remove oxygen, thereby improving the photospeed of the photopolymerizable element and facilitating the image formation process. C.L. Agre, U.S. Pat. No. 2,376,661, discloses the photopolymerization of polymer solutions in a controlled atmosphere. G. Oster, U.S. Pat. No. 2,875,047, L. Plambeck, Jr., U.S. Pat. No. 2,760,863 and N. T. Notley, U.S. Pat. No. 2,951,758 teach the exposure of photopolymerizable materials in an oxygen-reduced atmosphere.

The prior art methods for post-exposing photopolymerizable elements in a controlled atmosphere often involve time consuming techniques and costly and elaborate experimental procedures. Even the simplest methods — those using a cover sheet — afford no adequate medium for heat dissipation, giving rise to the danger of image distortion as a result of overheating.

A liquid provides an excellent barrier to oxygen in exposure of photopolymerizable elements. Furthermore, the liquid serves as a heat absorber, reducing the possibility of image distortion or support deformation resulting from overheating. The present invention also requires the simplest of materials and procedures and is therefore faster and more economical than most of the prior art methods. A further advantage of this invention is that it permits careful control of the experimental conditions, since any of a number of polymerization rate determining variables-liquid depth, exposure distance, light source, liquid medium — can be altered to produce the desired end results.

SUMMARY OF THE INVENTION

The invention comprises a process for post-hardening a photopolymerizable image by immersing said film image in a liquid that transmits actinic radiation and which is inert with respect to said photopolymerizable image, and exposing the image to actinic radiation for a short period.

An object of this invention is to provide improvements in the art of posttreatment of photopolymer film images. Another object is to provide a process for treating photopolymerizable elements which is simple, rapid, and economical. A further object is to provide such a process for hardening photopolymer film images. The more specific object is to provide a process for hardening photopolymer film images by postexposing the film image in a suitable liquid medium using actinic radiation. Still other objects will be apparent from the following description of the invention.

DESCRIPTION OF THE INVENTION

A film element comprising a photohardenable material on a base support is immersed in a liquid medium and exposed to a source of actinic radiation for postpolymerization of the photohardenable material.

In a preferred embodiment of the present invention, a film element comprising photopolymerizable film images on a polyethylene terephthalate support is immersed in water to a depth just sufficient to cover the film. The image areas are then exposed to actinic radiation for a period of a few seconds. Immediately following the postexposure step, the film is removed from the water, and the excess water is removed, e.g., with an air jet.

If the photopolymerizable element were allowed to remain in the liquid medium for any prolonged period of time, there is the danger that the liquid would leach out part of the monomer from the film, resulting in a brittle image. However, with water as the liquid medium, the exposure times used in this invention, 2–10 secs., are too short for leaching to be a problem.

Although it is desirable to have sufficient liquid to just cover the film element and to have the light source as close to the element as is practical, to assure the most rapid postpolymerization, these factors — liquid depth, distance of source — can be varied as the particular experiment and the desired results dictate.

The terms "photopolymerizable" and "photohardenable" as used herein refer to systems in which the molecular weight of at least one component of a light-sensitive layer is increased by exposure to radiation of sufficient intensity to result in a change in the rheological and thermal behavior of the exposed areas.

Photopolymerizable systems most suitable for postexposure by the process of this invention are those which will not be acted upon by the liquid medium during the period of exposure. Among the systems which can be used are: (1) those in which a photopolymerizable monomer is present alone or in combination with a compatible binder, or (2) those in which the photohardenable group, attached to a polymer backbone, becomes activated on exposure to light and may then crosslink by reacting with a similar group or other reactive sites on adjacent polymer chains. In the second group of suitable photohardenable systems, where the monomer or pendent photohardenable group is capable of addition polymerization, e.g., a vinyl monomer, the photopolymerized chain length may involve addition of many similar units initiated by a single photochemical act. When only dimerization of similar compounds is involved, e.g., benzophenone or cinnamoyl compounds, the average molecular weight of the photosensitive constituent can be at best, only doubled by a single photochemical act. Where a photopolymerizable molecule has more than one reactive site, a crosslinked network can be produced.

Suitable free-radical initiated, chain propagating addition polymerizable ethylenically unsaturated compounds for use in the simple monomer or monomer-polymer binder photopolymerizable layers are described in Burg et al., U.S. Pat. No. 3,060,023; Celeste et al., U.S. Pat. No. 3,261,686; and in Assignee's Cohen and Schoenthaler, U.S. Pat. No. 3,380,831. Polymers for use in the monomer-polymer binder system are described in Burg et al., U.S. Pat. No. 3,060,023.

Photodimerizable materials which may be treated by the process of the present invention are disclosed in Assignee's Celeste and Chu, U.S. application, Ser. No. 684,945, filed Nov. 22, 1967 and Celeste, U.S. Pat. No. 3,469,982.

The photopolymerizable system should also contain a free-radical generating addition polymerization initiator in the photopolymerizable layer. In addition, particularly where a photocrosslinkable polymer or dimer is used, the layer may also contain a plasticizing agent.

Suitable free-radical generating addition polymerization initiators, activatable by actinic light, e.g., ultraviolet and visible light are listed in U.S. Pat. No. 3,060,023; Assignee's Application to Chang and Fan U.S. Pat. No. 3,549,367 and other patents referred to above.

Preferred plasticizers are disclosed in Assignee's Application to Celeste and Chu, U.S. application Ser. No. 684,945, filed Nov. 22, 1967.

Materials useful as base supports for the photopolymerizable layer are those which adhere strongly to the photopolymer layer and are not acted upon by the liquid medium into which they are immersed. Thus, paper, polyester films, e.g., polyethylene terephthalate and cellulose triacetate, glass, ceramics, and flexible and rigid metals are suitable supports.

Light sources suitable for polymerizing the film images are determined by the nature of the photopolymer element and the liquid medium. The wavelength of light frequently depends on the opacity and transparency of the liquid, and thus it is necessary to use a light source of higher wavelengths than those to which the liquid is opaque. Since most of the photohardenable materials preferred in this invention generally exhibit their maximum sensitivity in the ultraviolet range, the light source should furnish an effective amount of this radiation. Such sources include carbon arcs, mercury vapor arcs, fluorescent lamps with ultraviolet light-emitting phosphors, argon glow lamps, electronic flash units, and photographic flood lamps. Other light sources are satisfactory when materials sensitive to visible light are used.

The length of exposure required for satisfactory post-polymerization of a given film element is a function of: type of light source used, distance between light source and film element, liquid medium, photopolymer film thickness, initiator, monomer, presence or absence of light absorbing pigments, character of image being reproduced, and depth of immersion of film in liquid.

A liquid, if it is to serve as a suitable post polymerization medium, should possess a number of desirable characteristics. The liquid should: (1) have a relatively high boiling point to eliminate the possibility of evaporation occurring during exposure, (2) be non toxic, noncorrosive, (3) be inexpensive, (4) not leach the monomer or have any deleterious effect on the film element, (5) be transparent to the actinic radiation, (6) not have its properties altered by the action of the light radiation, and (7) be easily removable from the film surface. Although water most suitably fulfills these requirements, almost any liquid may be used as the immersion medium, e.g., ethylene glycol, methanol, and high-boiling fluorinated hydrocarbons such as trichlorofluoro-methane, trichlorotrifluoroethane, and dibromotetrafluoro-ethane.

Although the distance between the light source and the film element is not critical to the success of the postpolymerization, for the most rapid exposure the photopolymer layer should be no more than a few inches from the light source.

The liquid remaining on the film element after the element has been taken from the liquid medium can be removed by directing a jet of air against the film, by siphoning the liquid from the support, or by wiping it off with an absorbent pad or a squeegee.

The invention will be further illustrated by, but is not intended to be limited to, the following detailed examples of various embodiments.

EXAMPLE I

A photopolymer film element comprising a resin-scrubbed polyethylene terephthalate base support, a clear photopolymerizable layer, a pigmented photopolymerizable layer, and a polyethylene terephthalate cover sheet is imagewise exposed to actinic radiation. See Assignee's Application to A. B. Cohen and V. F. H. Chu, Ser. No. 705,323, Example I, filed Feb. 14, 1968, now abandoned. Stripping the cover sheet from the photopolymerizable layers at 125° C. gives a positive image comprising underexposed, polymerizable material on the polyethylene terephthalate cover sheet. The film containing unpolymerized positive images is immersed at room temperature into a glass tray containing an amount of water just sufficient to cover the element. The image is exposed for 2 sec. to a source of ultraviolet radiation (Sylvania, Model SG-60, 1000 W Sun Gun) placed 3 inches from the element. The positive is removed from the water, and the remaining liquid is blown off by directing a jet of air against the film.

To test the hardness and wear of the post-polymerized film images, a length of polyethylene terephthalate film base was rubbed back and forth against the post-hardened images. No smearing or noticeable loss in image quality occurred. Smearing occurred immediately when the clear film base was rubbed against photopolymer film images that were not postexposed.

The postexposed positive was also very flexible.

EXAMPLE II

After imagewise exposure of a photopolymer film element comprising a polyethylene terephthalate base support, a photopolymer layer, and a polyethylene terephthalate cover sheet, the cover sheet is stripped from the photopolymer layer, and the positive image comprising the underexposed, polymerizable material on the polyethylene terephthalate cover sheet is transferred to a cellulose triacetate base by thermal lamination. See Assignee's Patent application to V. F. H. Chu and J. R. Celeste, Ser. No. 684,945, Example VIII, filed Nov. 22, 1967.

The cellulose triacetate film base is immersed into a glass tray holding one-fourth inch of water at room temperature and exposed to the light source used in Example I at a distance 1 inch from the liquid surface for 10 sec. After removing the positive from the water, the excess water is siphoned off the film base.

No smearing occurred when a length of cellulose triacetate film base was rubbed against the post-exposed image areas of the positive; however, smearing did occur when the clear film base was rubbed against an unpolymerized film image.

The postpolymerized images were of high quality, with excellent rendition of detail, and of a desirable hardness and flexibility.

EXAMPLE III

A photopolymer lithographic printing plate, wherein an opaque film element consisting of a matte surface coating on a polyethylene terephthalate support is substituted for the cover sheet in Example I, is prepared by imagewise exposure of the photopolymer layer through the support side of the film element, and stripping of the opaque cover sheet. The positive opaque film element is immersed in water at room temperature to a depth just sufficient to cover the photopolymer surface. The positive image is postexposed for 2 sec. at a distance 3 inches from the light source used in Example I.

A high quality, durable positive lithographic plate was obtained which would not smear when rubbed with a sheet of clear polyethylene terephthalate.

EXAMPLE IV

Example II was repeated except that the unexposed photopolymerizable image was transferred to a subbed polyethylene terephthalate film support of the type described in Alles et al. U.S. Pat. No. 2,627,088 by thermal lamination as described in Assignee's Patent Application, Celeste and Chu, Ser. No. 684,945, Example VIII, filed Nov. 22, 1967. The polymerizable element was immersed in a bath of liquid trichlorotrifluoroethane to a depth of one-fifth of an inch. The element was exposed as described in Example I to give a nontacky image of good quality as compared to a control which was tacky and showed smearing when tested in the manner described in Example I.

EXAMPLE V

Example III was repeated except that the photopolymerizable image was post-hardened by exposing in a liquid bath of ethylene glycol. The resulting image was of good quality and had the required hardness and flexibility.

Postexposure using the process and techniques of this invention offers a number of advantages over the prior art methods. The method is very fast, the post-exposure often taking no longer than the exposure itself. It is economical, requiring a minimal amount of apparatus and materials of the simplest type. Another advantage of the present invention is that it permits easy control of the degree of hardening, since any of a number of factors can be easily varied. A further advantage is that post-exposure in a liquid provides a medium for heat dissipation, keeping the film cool and therein decreasing the possibility of image distortion resulting from overheating the film element. The liquid medium is also much more effective in eliminating the influence of oxygen on the polymerization process, than are the methods employed in the prior art.

Postexposure of a photopolymer film element not only protects the image from distortion, but it also provides for much easier handling of the film. Furthermore, the posthardened images exhibit improved tensile properties, while the printing characters exhibit a decreased sensitivity to solvents and inks.

I claim:

1. A process for hardening a photohardenable image which comprises immersing said image in a liquid that transmits actinic radiation and which is inert with respect to the photohardenable material, and exposing said image to actinic radiation.

2. A process according to claim 1 wherein said actinic radiation comprises ultraviolet radiation and the exposure is carried out for 2 – 10 seconds.

3. A process according to claim 1 wherein said liquid is water.

4. A process according to claim 1 wherein the image is solid and comprises:

a. at least one free-radical initiated, chain propogating, nongaseous, addition polymerizable compound, b. at least one macromolecular organic polymer binding agent, and c. an addition polymerization initiator.

5. A process according to claim 1 wherein the photohardenable image is in a layer coplanar with complementary photohardened images.

6. A process according to claim 1 wherein the photohardenable image is the sole image in the layer.

7. A process according to claim 1 wherein said liquid is ethylene glycol.

8. A process according to claim 1 wherein said liquid is fluorinated hydrocarbon.

9. A process according to claim 8 wherein said liquid is trichlorotrifluoroethane.

* * * * *